United States Patent [19]

Libregts

[11] Patent Number: 5,521,784
[45] Date of Patent: May 28, 1996

[54] COVER LAYER IN FILTER UNIT FOR CONNECTORS

[75] Inventor: Hubertus B. Libregts, Vlijmen, Netherlands

[73] Assignee: Berg Technology, Inc., Reno, Nev.

[21] Appl. No.: 416,774

[22] PCT Filed: Oct. 11, 1993

[86] PCT No.: PCT/NL93/00200

§ 371 Date: Aug. 2, 1995

§ 102(e) Date: Aug. 2, 1995

[87] PCT Pub. No.: WO94/09535

PCT Pub. Date: Apr. 28, 1994

[30] Foreign Application Priority Data

Oct. 9, 1992 [NL] Netherlands ............................ 9201753

[51] Int. Cl.⁶ .............................. H01G 4/38; H03H 7/00
[52] U.S. Cl. .......................... 361/328; 361/302; 361/330; 333/182; 439/620
[58] Field of Search .................................. 361/302–303, 361/305, 306.1, 306.2, 306.3, 309, 311–312, 328–330; 333/182–185; 439/607, 610, 620

[56] References Cited

U.S. PATENT DOCUMENTS

| | | | |
|---|---|---|---|
| 4,611,882 | 9/1986 | Ushida | 361/303 |
| 4,682,129 | 7/1987 | Bakermans et al. | 333/184 |
| 4,791,391 | 12/1988 | Linnell et al. | 333/184 |
| 4,931,754 | 6/1990 | Moussie | 333/184 |
| 5,130,780 | 7/1992 | Kumai et al. | |
| 5,150,086 | 9/1992 | Ito | 333/182 |
| 5,167,539 | 12/1992 | Okamoto et al. | 439/620 |

FOREIGN PATENT DOCUMENTS

| | | |
|---|---|---|
| 0124264A1 | 11/1984 | European Pat. Off. . |
| 0299563A1 | 1/1989 | European Pat. Off. . |
| 2-183600 | 7/1990 | Japan . |

*Primary Examiner*—Bot L. Ledynh
*Attorney, Agent, or Firm*—Woodcock Washburn Kurtz Mackiewicz & Norris

[57] ABSTRACT

Filter unit for connectors comprising at least a substrate (2) made of electrically insulating material and having two mutually opposite sides and through openings (3) for contact elements of the connector, capacitors being situated at least one of the two sides of the substrate in the region of the through openings, which capacitors each comprise at least one first conducting layer (5) in contact with the substrate, a dielectric layer (7) and a second conducting layer (9) and there being provided above each of the capacitors a cover layer (13, 22) composed of at least one first flexible layer (13) substantially covering the top surface of each of the capacitors and having a low moisture absorption coefficient and a high moisture diffusion coefficient and a second hard layer (22) at least entirely covering the first flexible layer and having a high moisture absorption coefficient and a low moisture diffusion coefficient.

4 Claims, 2 Drawing Sheets

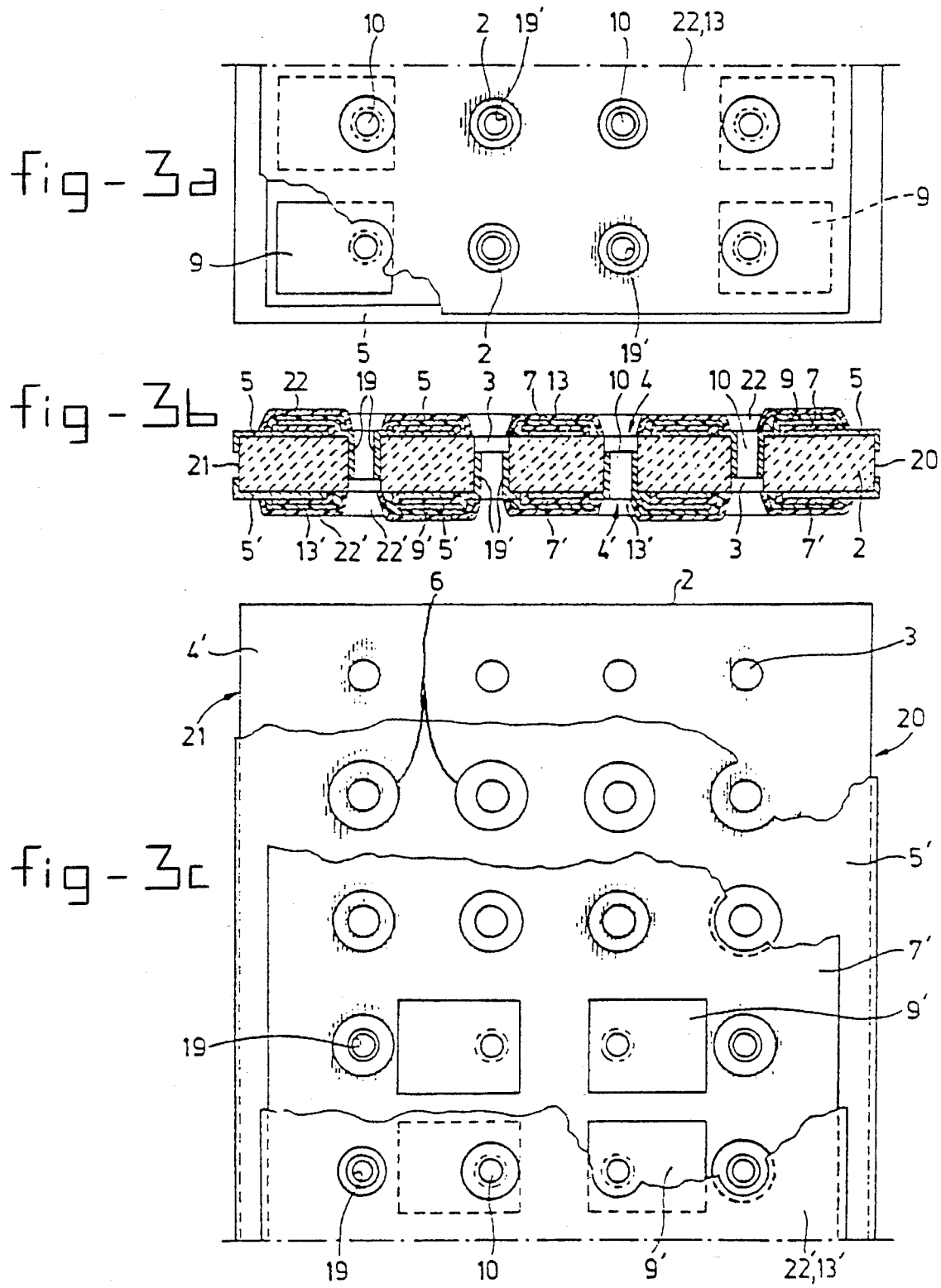

COVER LAYER IN FILTER UNIT FOR CONNECTORS

BACKGROUND OF THE INVENTION

The invention relates to a filter unit for connectors comprising:

at least one substrate made of electrically insulating material and having two mutually opposite sides and through openings for contact elements of the connector;

capacitors situated on at least one of the two opposite sides of the substrate in the region of the through openings, each of said capacitors comprising at least one first conducting layer in contact with the substrate, a dielectric layer and a second conducting layer; and at least one passivating, electrically insulating cover layer disposed above each of said capacitors, said cover layer comprising at least one first flexible passivating, electrically insulating layer having a low moisture absorption coefficient, and a second hard layer.

Such a filter unit is disclosed by European Patent Application EP-A-0 124 264.

In electrical transmission engineering, pulse-type signals are increasingly being used to transmit information. As known in electrical engineering, pulse-type signals can be broken down into a series of sinusoidal signals having increasing frequency, the so-called higher harmonics. In the case of signals having a high pulse frequency, as is usual in the case of computers, higher harmonics may occur in the megahertz region or even up into the gigahertz region.

The steepness of the pulse edges, also referred to as the rise time, likewise plays an important role. A normal rise time of one nanosecond corresponds to a higher harmonic frequency of approximately 350 MHz, regardless of the pulse frequency itself.

Such higher harmonics are found to be very troublesome. In a space in which various interconnected electronic processing apparatuses which generate pulse-type signals are present, interferences readily occur in the information processing as a consequence of the higher harmonic signals. Such interferences may assume a proportion such that the correct functioning of, for example, computers is no longer possible.

In order to be able to keep the total interference level as low as possible, it is necessary to use filters with which the undesirable higher harmonic frequencies can be attenuated without the desired information signal being excessively distorted. A capacitor is a component which is suitable for this purpose because its reactance is inversely proportional to the frequency. That is to say, the reactance is greater for relatively low frequencies than for higher frequencies.

European Patent Application 0,124,264, referred to above, discloses a filter unit for connectors in which two cover layers may be used on the capacitors. An inner cover layer covering the capacitor is composed of glass and an outer cover layer covering the inner cover layer is made of silicone. This known combination of cover layers is unsuitable for fairly large surface areas because, in that case, the mechanical stresses in the glass become too high with increasing temperature owing to the different temperature coefficients and cracks may occur. Because the outer layer is composed of silicone, which has a high moisture diffusion coefficient, moisture is then able to penetrate the capacitors via the two cover layers.

In another filter unit, as described in EP-A-0,299,563, each of the contact devices of a connector is decoupled to earth (chassis) with the aid of a capacitor. The filter unit is manufactured by the so-called thick-film screen-printing technology on a flat substrate. Such methods permit capacitors to be inexpensively manufactured which have an inductance low enough to attenuate signals effectively at high frequencies. The capacitance value of the flat capacitors produced in this way is directly proportional to the surface area of the mutually opposite electrodes and the relative permittivity of the dielectric material present in between, but is inversely proportional to the distance between the electrodes.

In the filter unit, known from EP-A-0,299,563 the capacitors are covered with a protective cover layer, which may be made up of various sublayers. Previously, silicone, which is flexible and has a low moisture absorption coefficient and a high moisture diffusion coefficient, has been used for all these layers. As a result of its flexibility, silicone is very suitable for use over fairly large surface areas because it readily adapts to the expanded form of the filter unit at higher temperatures. Usually such filters have to be washed after manufacturing by a suitable solvent. Previously used solvents, however, affect the ozone layer and, therefore, alternative solvents are needed. Such an alternative is a deionized water solution. However, it appears that silicone is not sufficiently resistant to deionised water solutions used in washing, for example, those provided with 10% Lonco Terge 520 D detergent. If washing is carried out with this solvent, moisture can penetrate the capacitor, with short circuiting or a low dielectric breakdown voltage as a result.

In US-A-5,130,780 a dual in-line packaging is described which comprises a substrate with a first cover layer of a first material covering the bottom surface of the substrate and a second cover layer of a second material covering the top surface of the substrate. The first material is resilient and moisture resistant and the second material is hard compared to the first material. During manufacturing of the known device, the first layer is first applied to the bottom surface and partly to the peripheral surface of the packaging; next, the second layer is applied to the top surface and, again, partly to the peripheral surface, thus producing a cover layer at the peripheral surface that comprises two sub-layers: a first sub-layer that is resilient and moisture resistant and a second sub-layer that is hard compared to the first sub-layer. Since by a suitable choice of the first and second materials a good adherence between them occurs at the peripheral surface where they overlap moisture is also prevented from entering the inside of the packaging via the junction interface between the first and second layer at the peripheral surface. However, in the known device the overlap of the first and second layers at the peripheral surface is only established because of preventing moisture to enter the device via the interface between the first and second layers. The bottom surface is entirely covered by one cover layer, i.e., a resilient layer, whereas the top layer is also entirely covered by one layer, i.e., a hard layer. Therefore, the known device is also not sufficiently resistant to deionised water solutions used in washing; especially, moisture can penetrate into the known device through the first cover layer at the bottom surface during washing with deionised water.

The object of the invention is to provide a filter unit of the type mentioned at the outset, which is completely moisture- and contamination-repellent, even if washing is carried out with deionised water.

SUMMARY OF THE INVENTION

To achieve this object, the invention provides a filter unit of the above-mentioned type, characterized in that the first flexible layer substantially covers the top surface of each of said capacitors and said second hard layer is made of a material having a high moisture absorption coefficient and a low moisture diffusion coefficient, and covers said first flexible layer. Such a combination of cover layers is extremely moisture- and contamination-repellent. An additional advantage is that moisture left behind in the capacitor can still escape from the capacitor via the first cover layer, which has a high moisture diffusion coefficient, and can be absorbed in the second cover layer, which has a high moisture absorption coefficient. This provides a dry cover layer between the capacitor and the second cover layer. Furthermore, the flexibility of the first layer ensures that consequences of different temperature coefficients between the capacitors and the second (hard) layer are absorbed. This is especially important in the case of fairly large surface areas.

In a first embodiment, the first layer of said cover layer comprises silicone.

The second layer comprises preferably epoxy.

In the filter unit according to the invention, capacitors which are all covered with the cover layer may be located on both sides of the substrate.

BRIEF DESCRIPTION OF THE DRAWINGS

The invention will be explained in greater detail below by reference to some exemplary embodiments of the filter unit as represented in the attached drawings, in which:

FIGS. 3a, 3b and 3c diagrammatically show various views and a section of an embodiment of the filter unit for use in a four-row connector.

DETAILED DESCRIPTION OF THE EMBODIMENTS

Figure 1:
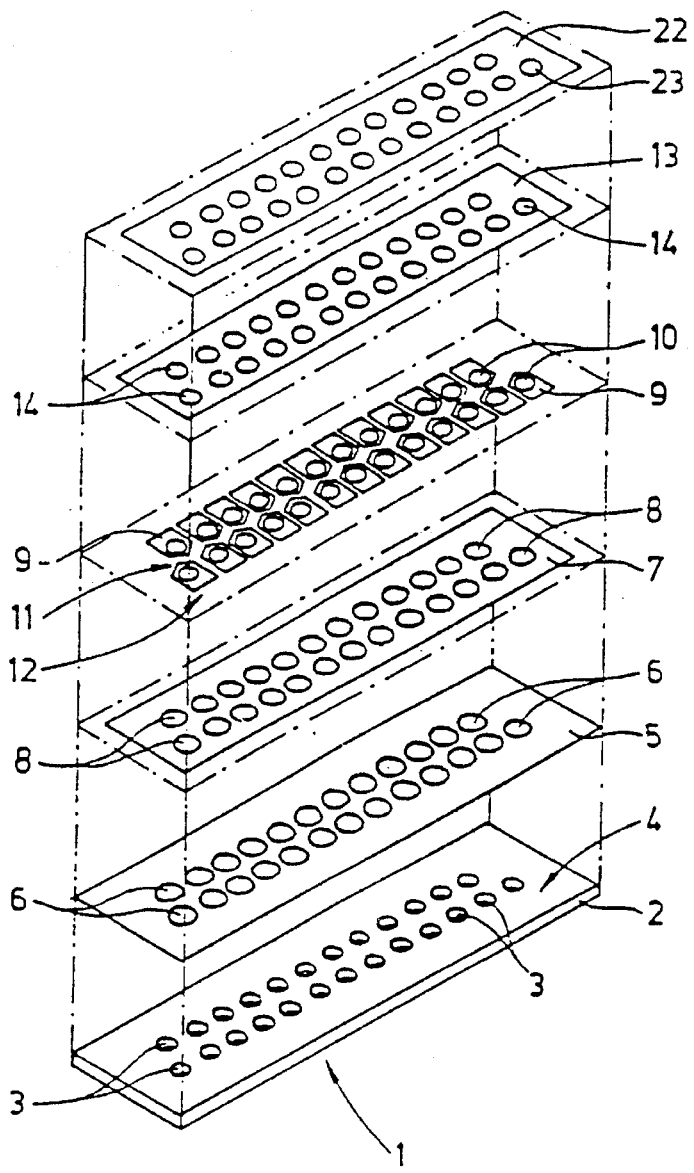
FIG. 1 shows, in perspective, an embodiment of the filter unit in a view with the parts taken apart.

FIG. 1 shows layer-by-layer the structure of an embodiment of the filter unit 1. The flat substrate 2 has through openings 3 with a mutual spacing which is such that the filter unit is suitable for mounting in a two-row connector. A first electrode 5 composed of a layer of electrically conducting material and having through openings 6 which are situated so as to correspond to the through openings 3 in the substrate 2 is provided over the substrate side 4. The through openings 6 have a larger diameter than the through openings 3 of the substrate 2. Provided on the first electrode 5 is a layer 7 of dielectric material which has correspondingly situated through openings 8.

The diameter of said through openings 8 is preferably equal to, or slightly larger than, the diameter of the through openings 3 in the substrate 2. Provided on the layer 7 are electrode patches 9 made of electrically conducting material and having a through opening 10, which electrode patches, together with the first electrode 5 and the dielectric layer 7, form the filter capacitors. The electrode patches 9 are arrow-shaped, the pointed end 11 surrounding the through opening 10 and the wide end 12 extending towards an edge of the substrate 2. With the electrode patches 9 situated as shown, a filter unit can be manufactured for a two-row connector having a relatively small pitch spacing in the order of magnitude of 2 mm. Although not necessary, the electrode patches 9 may extend along the wall of the through openings 3 of the substrate 2. Provided on the electrode patches 9 are a first cover layer 13 and a second cover layer 22 of electrically insulating material, whose respective openings 14, 23 have a dimension such that the filter unit can be fitted over the contact devices of a connector. In this case, the electrode patches 9 are connected in the assembled state to the contact devices of the connector by means of soldering and the first electrode 5 is soldered to the connector housing.

Figure 2:
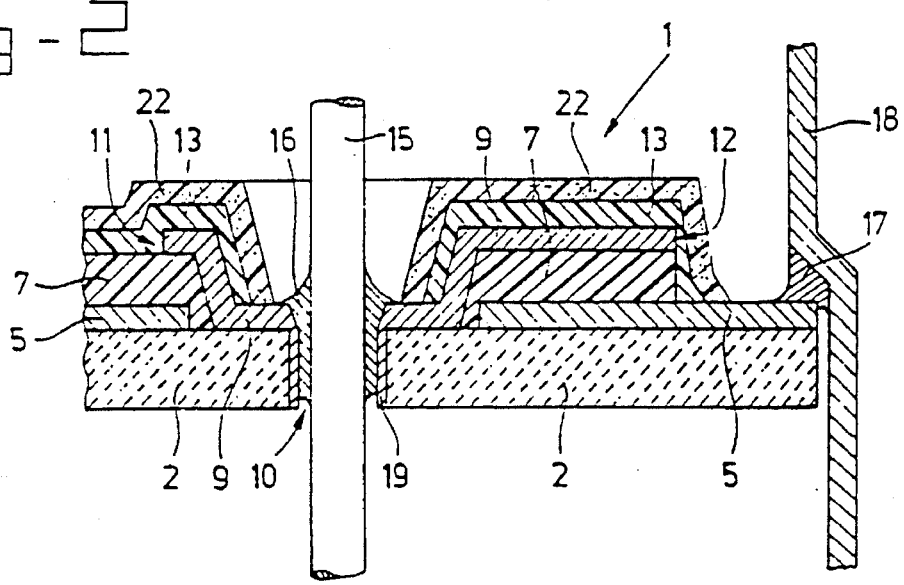
FIG. 2 shows, on an enlarged scale, a section through a single electrode part of the filter unit shown in FIG. 1 and connected to a connector.

FIG. 2 shows, on an enlarged scale, a section through an electrode patch 9 of the filter unit 1 shown in FIG. 1 and connected to a connector, as seen from the narrow edge of the substrate 2. The portion 19 of the electrode patch 9 extends along the wall of the through opening 3 of the substrate 2. Accommodated in the through opening 10 bounded thereby is a connecting pin 15 of the connector. The connecting pin 15 is joined to the electrode patch 9 by means of solder 16. The first electrode 5 is connected to a wall 18 of the housing of the connector by means of solder 17.

The substrate 2 of the filter unit is preferably composed of aluminium oxide ($Al_2O_3$), the capacitor electrodes of an alloy of palladium and silver, and the dielectric of barium titanate ($BaTiO_3$). It is obvious that various different dielectric layers or sublayers may be used instead of one single dielectric layer 7. The situation of the capacitor electrodes 5, 9 may also be interchanged with respect to the structure shown in FIG. 1.

At least two cover layers 13, 22, provided with through openings 14, 23, are provided on the electrode patches 9 to protect the filter unit against moisture and contaminants. The first layer 13 is manufactured from a flexible material having low moisture absorption coefficient and high moisture diffusion coefficient. The second layer 22 is composed of a rigid material having high moisture absorption coefficient and low moisture diffusion coefficient. Silicone is a suitable material for the first layer 13, whereas epoxy is preferably used for the second layer. Such a combination of cover layers 13, 22 provides excellent protection for the capacitor against moisture and contaminants and is also resistant to washing in deionised water provided with a standard detergent, for example 10% Lonco Terge 520 D. Because the first layer 13 is flexible, it absorbs the difference in temperature coefficient between the electrode patches 9 and the second cover layer 22, which is important, especially in the case of fairly large surface areas. Because of its low moisture diffusion coefficient, the second cover layer 22 prevents moisture from being able to reach the capacitor of the filter unit, which could bring about short circuits and/or a low dielectric breakdown voltage. If desired, the first layer 13 may be made up of various sublayers. The same applies to the second layer 22.

FIG. 3 shows the structure of an embodiment of the filter unit according to the invention for use in a four-row connector, capacitors being formed on the two flat sides of the substrate of the filter unit. In FIG. 3, the layers and elements corresponding to the known filter unit shown in FIG. 1 are indicated by the same reference numerals. The corresponding layers and elements situated on the opposite flat substrate side are also indicated by the same reference numerals, but provided with a prime. FIG. 3b shows a section similar to FIG. 2, whereas FIG. 3a shows a view with parts broken away from one flat side and FIG. 3c with parts broken away from the other flat side of the filter unit according to the invention.

The electrode patches 9, 9' on either side of the substrate 2 are arranged so that the electrode patches 9 which belong to the two outermost rows of through openings are provided on one side 4 of the substrate and the electrode patches 9' belonging to the two innermost rows of through openings are provided on the other side 4'. Each through opening 3 of the substrate 2 is therefore surrounded by an electrode patch 9 or 9', respectively, only on one side of the substrate. The parts 19, 19' of the electrode patches 9, 9' extending along the wall of the through openings have a length such that they do not make electrical contact with the electrodes of the capacitors situated on the opposite substrate side.

Two cover layers 13, 13' are located on the electrode patches 9, 9'. The properties of the first cover layer 13, 13' are the same as those of the first cover layer 13 of the device according to FIG. 2, whereas the properties of the second cover layer 22, 22' correspond to those of the second cover layer 22 in FIG. 2. The first cover layer 13, 13' is again preferably manufactured from silicone and the second cover layer 22, 22' from epoxy.

The two first electrodes 5, 5' extend partly along the narrow edges 20, 21 in the longitudinal direction of the substrate 2.

As a departure from FIG. 3, the electrode patches 9, 9' can be arranged in various ways. The electrode patches belonging to the through openings situated adjacently in a row or column may, for example, be provided in each case at a different side of the substrate. In the case of a substrate which is provided with at least two rows of through openings, the electrode patches belonging to the through openings of a row or column may be situated on one side of the substrate and the electrode patches belonging to another, for example adjacent, row or column may be situated at the other side of the substrate.

From the views shown in FIGS. 3a and c of the four-row filter unit according to the invention, it is clearly visible that there is sufficient room on both sides of the substrate to provide electrode patches for the manufacture of filter capacitors of suitable size, comparable with those of the two-row known filter unit shown in FIG. 1. As a consequence, inter alia, of the drive towards miniaturisation and as a result of the high density of current integrated circuits, there is a great need for connectors having a high contact element density, that is to say having a large number of contact elements per unit volume. The present filter unit may advantageously be used for connectors of this type.

Although rectangular electrode patches have been shown in the above embodiments of the filter unit according to the invention, electrode patches having a different geometrical circumference, for example round, square, hexagonal electrode patches etc., can also be used. Instead of round through openings, openings having a slit-shaped, square or other section can of course also be used, all these features being dependent on the shape of the connecting devices of the connector.

Although the first electrodes 5, 5' in FIGS. 3 and 4 are shown as a single layer on either side of the substrate, they can of course also comprise various sublayers which each extend over a portion of a substrate side 4, 4' to at least one edge of the substrate 2.

The filter unit is not, of course, limited to the embodiments indicated in the description and the figures but it can be modified and extended in various ways without departing from the scope of the invention. In this connection, it is possible to conceive, inter alia, the provision of semiconducting layers and/or electrode patches for the formation of combinations of resistors (R) and capacitors (C), the so-called RC filters. The structures, for example, on each side of the substrate may also comprise a centre electrode which acts as a chassis electrode, which structures are provided with electrode patches situated on either side thereof and separated by one or more dielectric layers in order to increase the filter capacitance still further.

I claim:

1. A filter unit (1) for connectors comprising:

at least one substrate (2) made of electrically insulating material and having two mutually opposite sides and through openings (10) for contact elements (15) of the connector;

capacitors situated on at least one of the two opposite sides of the substrate (2) in the region of the through openings (10), each of said capacitors comprising at least one first conducting layer (5) in contact with the substrate, a dielectric layer (7) and a second conducting layer (9); and at least one passivating, electrically insulating cover layer disposed above each of said capacitors, said cover layer comprising at least one first flexible passivating, electrically insulating layer (13) having a low moisture absorption coefficient, and a second hard layer (22), characterized in that the first flexible layer (13) substantially covers the top surface of each of said capacitors and said second hard layer (22) is made of a material having a high moisture absorption coefficient and a low moisture diffusion coefficient, and covers said first flexible layer (13).

2. A filter unit according to claim 1, wherein the first layer (13) of said cover layer comprises silicone.

3. A filter unit according to claim 1, wherein the second layer (22) of said cover layer comprises epoxy.

4. A filter unit according to claim 1, wherein said capacitors which are covered by said cover layer (13, 22) are located on both sides of said substrate (2).

\* \* \* \* \*